(12) United States Patent
Takezawa et al.

(10) Patent No.: US 11,587,787 B2
(45) Date of Patent: Feb. 21, 2023

(54) FILM FORMING METHOD AND FILM FORMING APPARATUS

(71) Applicant: Tokyo Electron Limited, Tokyo (JP)

(72) Inventors: Yoshihiro Takezawa, Nirasaki (JP); Daisuke Suzuki, Nirasaki (JP); Hiroyuki Hayashi, Nirasaki (JP); Yutaka Motoyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 33 days.

(21) Appl. No.: 17/132,656

(22) Filed: Dec. 23, 2020

(65) Prior Publication Data

US 2021/0202248 A1    Jul. 1, 2021

(30) Foreign Application Priority Data

Dec. 26, 2019    (JP) .............................. JP2019-236788

(51) Int. Cl.
*H01L 21/02*        (2006.01)
*H01L 21/3065*     (2006.01)
*H01L 21/306*       (2006.01)

(52) U.S. Cl.
CPC .... *H01L 21/02595* (2013.01); *H01L 21/0245* (2013.01); *H01L 21/02505* (2013.01); *H01L 21/02513* (2013.01); *H01L 21/02532* (2013.01); *H01L 21/02592* (2013.01); *H01L 21/02669* (2013.01); *H01L 21/02672* (2013.01); *H01L 21/0262* (2013.01); *H01L 21/02381* (2013.01); *H01L 21/02488* (2013.01); *H01L 21/3065* (2013.01); *H01L 21/30604* (2013.01)

(58) Field of Classification Search
None
See application file for complete search history.

(56) References Cited

U.S. PATENT DOCUMENTS

| 5,488,000 A | * | 1/1996 | Zhang | ............... | H01L 21/02488 |
| | | | | | 438/479 |
| 2005/0072976 A1 | * | 4/2005 | Cleeves | ............ | H01L 21/02675 |
| | | | | | 257/E29.292 |
| 2009/0278169 A1 | * | 11/2009 | Hayashi | ................ | H01L 21/046 |
| | | | | | 257/E21.09 |

(Continued)

FOREIGN PATENT DOCUMENTS

JP         2015-115435 A       6/2015

OTHER PUBLICATIONS

Kiegel et al, Process for the Solid Phase Crystallization of an Amorphous or Polycrystalline Layer, DE 102011100056A1, Oct. 31, 2012 (Year: 2012).*

(Continued)

*Primary Examiner* — Alexander G Ghyka
(74) *Attorney, Agent, or Firm* — Nath, Goldberg & Meyer; Jerald L. Meyer; Tanya E. Harkins

(57) ABSTRACT

A film forming method includes: forming a laminated film, in which an interface layer, a bulk layer, and a surface layer are laminated in this order, on a base; and crystallizing the laminated film, wherein the bulk layer is formed of a film that is easier to crystallize than the interface layer in crystallizing the laminated film, and wherein the surface layer is formed of a film that is easier to crystallize than the bulk layer in crystallizing the laminated film.

12 Claims, 10 Drawing Sheets

(56) References Cited

U.S. PATENT DOCUMENTS

2011/0254128 A1* 10/2011 Kuriki .................. H01L 29/045
   257/532
2015/0159295 A1* 6/2015 Takahashi ............... C30B 1/023
   117/200
2020/0161130 A1* 5/2020 Motoyama ........ H01L 21/02502

OTHER PUBLICATIONS

Okajima et al, Substrate for Liquid Crystal Display Panel, and Liquid Crystal Display Device, WO 2012102158, Aug. 2, 2012 (Year: 2012).*

* cited by examiner

FIG. 8

| | In-film hydrogen concentration (H) | | In-film chlorine concentration (Cl) | |
|---|---|---|---|---|
| | a-Si(SiH$_4$) | a-Si(Cl-dope) | a-Si(SiH$_4$) | a-Si(Cl-dope) |
| Before heat treatment | $6.25 \times 10^{19}$ | $6.03 \times 10^{19}$ | Not exceeding $5 \times 10^{15}$ (Background level) | $1.81 \times 10^{17}$ |
| After heat treatment | $7.39 \times 10^{17}$ | $7.36 \times 10^{17}$ | Not exceeding $5 \times 10^{15}$ (Background level) | $5.02 \times 10^{16}$ |

FILM FORMING METHOD AND FILM FORMING APPARATUS

CROSS-REFERENCE TO RELATED APPLICATION

This application is based upon and claims the benefit of priority from Japanese Patent Application No. 2019-236788, filed on Dec. 26, 2019, the entire contents of which are incorporated herein by reference.

TECHNICAL FIELD

The present disclosure relates to a film forming method and a film forming apparatus.

BACKGROUND

A polycrystalline silicon film may be used as a channel of a three-dimensional NAND structure. Patent Document 1 discloses a method of forming a polycrystalline silicon film by laminating, on a first amorphous silicon film in which crystals grow slowly, a second amorphous silicon film in which crystals grow faster than in the first amorphous silicon film, and then performing a crystallization process.

PRIOR ART DOCUMENT

[Patent Document]
Patent Document 1: Japanese laid-open publication No. 2015-115435

SUMMARY

According to an aspect of the present disclosure, a film forming method includes: forming a laminated film, in which an interface layer, a bulk layer, and a surface layer are laminated in this order, on a base; and crystallizing the laminated film, wherein the bulk layer is formed of a film that is easier to crystallize than the interface layer in crystallizing the laminated film, and wherein the surface layer is formed of a film that is easier to crystallize than the bulk layer in crystallizing the laminated film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a view showing exemplary evaluation results obtained by using SIMS.

DETAILED DESCRIPTION

Figure 1:
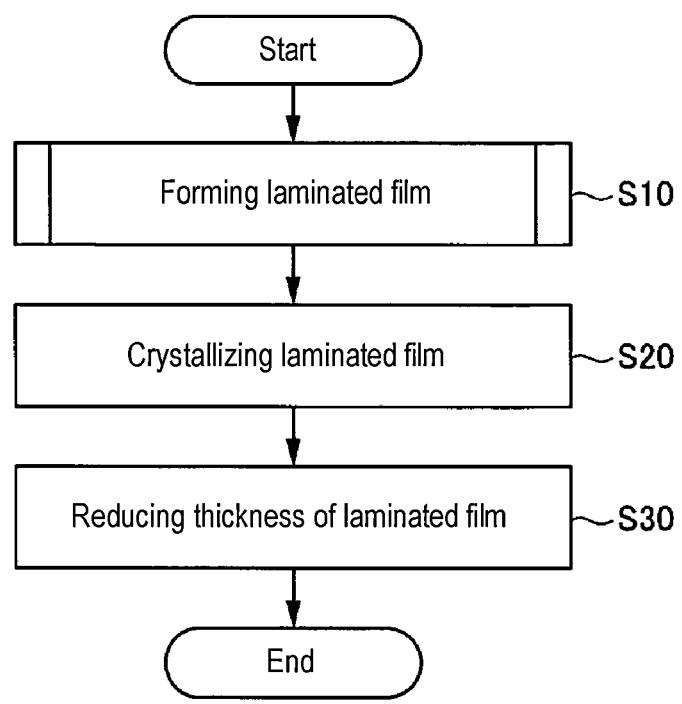
FIG. 1 is a flowchart illustrating a film forming method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant explanations will be omitted.

[Film Forming Method]

A film forming method according to an embodiment will be described by taking the case of forming a polycrystalline silicon film as an example. FIG. 1 is a flowchart illustrating a film forming method according to the embodiment. The film forming method of the embodiment includes step S10 of forming a laminated film, step S20 of crystallizing the laminated film, and step S30 of reducing a thickness of the laminated film.

(Step S10 of Forming Laminated Film)

Figure 2:
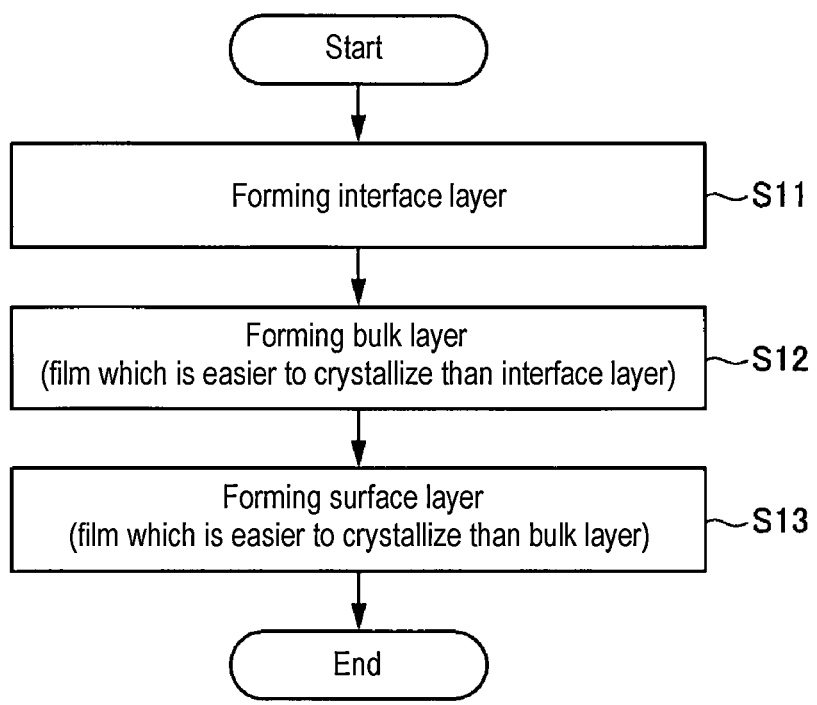
FIG. 2 is a flowchart illustrating an exemplary step of forming a laminated film in the film forming method of FIG. 1.
Figure 3A:
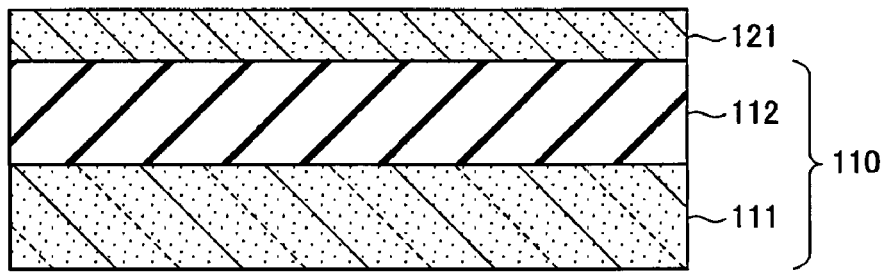
FIGS. 3A to 3C are cross-sectional views illustrating an exemplary step of forming a laminated film in the film forming method of FIG. 1.
Figure 3B:
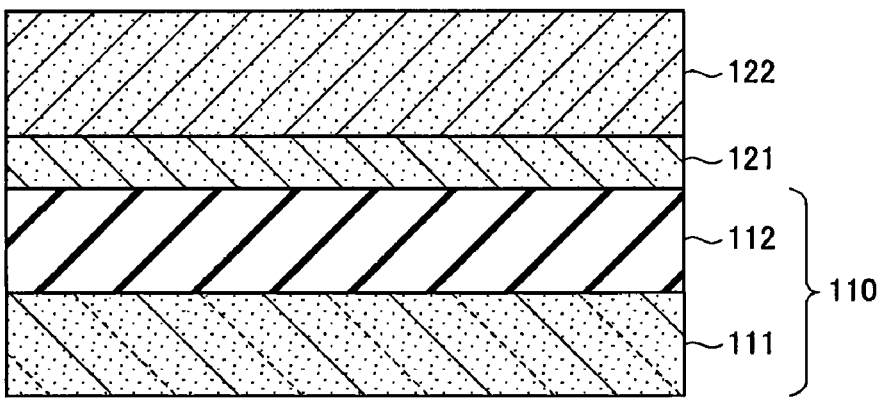
Figure 3C:
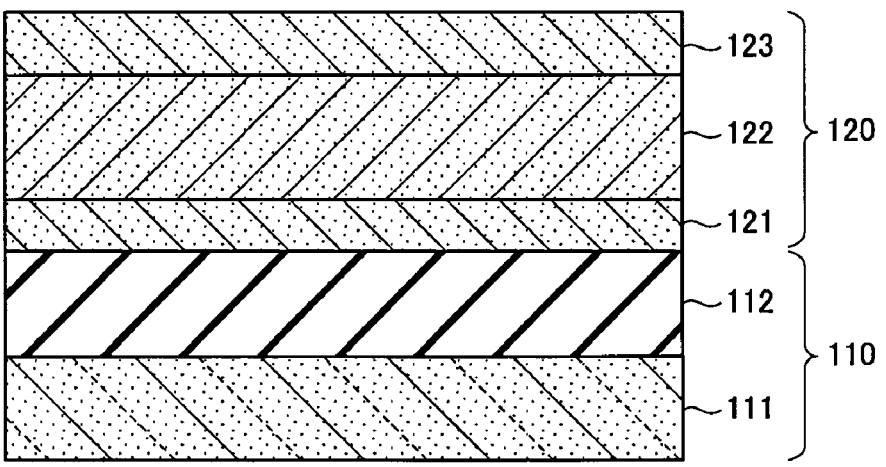

FIG. 2 is a flowchart illustrating an example of step S10 of forming the laminated film in the film forming method of FIG. 1. FIGS. 3A to 3C are cross-sectional views illustrating an example of step 10 of forming the laminated film in the film forming method of FIG. 1.

Step S10 of forming the laminated film is a process of forming a laminated film in which an interface layer, a bulk layer, and a surface layer are laminated in this order. The thickness of the laminated film formed in step S10 of forming the laminated film is greater than, for example, a designed target film thickness. In the present embodiment, step S10 of forming the laminated film includes step S11 of forming the interface layer, step S12 of forming the bulk layer, and step S13 of forming the surface layer.

In step S11, as illustrated in FIG. 3A, an interface layer 121 is formed on a base 110. In the present embodiment, the base 110 includes a substrate 111 and an insulating film 112. The substrate 111 may be, for example, a semiconductor wafer such as a silicon wafer. The insulating film 112 is formed on a surface of the substrate 111. The insulating film 112 may be, for example, a silicon oxide film ($SiO_2$ film) or a silicon nitride film (SiN film).

The interface layer 121 is formed of, for example, an amorphous silicon film containing silicon (Si) and hydrogen (H). The amorphous silicon film is formed through, for example, an atomic layer deposition (ALD) method or a chemical vapor deposition (CVD) method using, for example, a higher-order silane gas. As the higher-order silane gas, for example, a silane gas containing two or more silicon atoms in one molecule, such as $Si_2H_6$, $Si_3H_8$, or $Si_4H_{10}$, may be used. By using the higher-order silane gas, it is possible to form an amorphous silicon film having a high hydrogen concentration in the film. In addition, the interface layer 121 may be formed of, for example, an amorphous silicon film containing silicon and impurities that inhibit crystallization. Impurities that inhibit crystallization may include, for example, oxygen (O), carbon (C), and nitrogen (N). The amorphous silicon film is formed through, for example, an ALD method or a CVD method using a silicon source gas and a gas containing impurities that inhibit crystallization. As the silicon source gas, for example, $SiH_4$, $Si_2H_6$, $Si_3H_8$, or $Si_4H_{10}$ may be used. As the gas containing impurities that inhibit crystallization, for example, $N_2O$, $NO$, $C_2H_4$, $NH_3$, $N_2H_4$, or monomethylhydrazine (MMH) may be used.

In step S12, as illustrated in FIG. 3B, a bulk layer 122 is formed on the interface layer 121. The bulk layer 122 is formed of a film that is easier to crystallize than the interface layer 121 in step S20 of crystallizing the laminated film. The bulk layer 122 is formed of an amorphous silicon film containing, for example, silicon and hydrogen, and having a hydrogen concentration in the film lower than that of the amorphous silicon film forming the interface layer 121. The amorphous silicon film is formed through, for example, an ALD method or a CVD method using a silane-based gas having a lower order than the higher-order silane-based gas used when forming the interface layer 121. For example, when $Si_2H_6$ is used to form the interface layer 121, $SiH_4$ may be used as the silane-based gas. The bulk layer 122 may be, for example, a layer thicker than the interface layer 121. In addition, the bulk layer 122 may have a multi-layer structure. In this case, each layer of the multi-layer structure is formed of a film that is easier to crystallize than the interface layer 121 in step S20 of crystallizing the laminated film.

In step S13, as illustrated in FIG. 3C, a surface layer 123 is formed on the bulk layer 122. The surface layer 123 is formed of a film that is easier to crystallize than the bulk layer 122 in step S20 of crystallizing the laminated film. The surface layer 123 is formed of an amorphous silicon film containing, for example, silicon and hydrogen, and having a hydrogen concentration in the film lower than that of the amorphous silicon film forming the bulk layer 122. The amorphous silicon film is formed through, for example, an ALD method or a CVD method using a processing condition under which hydrogen is less likely to be incorporated into the film than a processing condition used when forming the bulk layer 122. In addition, the surface layer 123 may be formed of, for example, an amorphous silicon film containing silicon and impurities that promote crystallization. Examples of impurities that promote crystallization include chlorine (Cl), phosphorus (P), boron (B), germanium (Ge), aluminum (Al), nickel (Ni), and fluorine (F). The amorphous silicon film is formed through an ALD method or a CVD method using a silicon source gas and a gas containing impurities that promote crystallization. As the silicon source gas, for example, $SiH_4$, $Si_2H_6$, $Si_3H_8$, or $Si_4H_{10}$ may be used. As the gas containing impurities that promote crystallization, for example, dichlorosilane (DCS), $PH_3$, $BCl_3$, $B_2H_6$, $GeH_4$, $GeCl_4$, $AlCl_3$, trimethylaluminum (TMA), or $SiF_4$ may be used. The surface layer 123 may be formed of silicon-free impurities that promote crystallization, or may be formed by doping a surface of the bulk layer 122 with impurities that promote crystallization.

Through steps S11 to S13 described above, a laminated film 120, in which the interface layer 121, the bulk layer 122, and the surface layer 123 are laminated in this order, is formed on the base 110.

(Step S20 of Crystallizing Laminated Film)

Step S20 of crystallizing the laminated film is performed after step S10 of forming the laminated film. In the present embodiment, step S20 of crystallizing the laminated film includes a step of crystallizing the amorphous silicon films forming the laminated film 120 by heat-treating (annealing) the laminated film 120 so as to form a polycrystalline silicon film. The annealing temperature may be, for example, 550 to 800 degrees C.

(Step S30 of Reducing Thickness of Laminated Film)

Step S30 of reducing the thickness of the laminated film is performed after step S20 of crystallizing the laminated film. In the present embodiment, step S30 of reducing the thickness of the laminated film includes a step for reducing the thickness of the laminated film 120 to a target film thickness by etching back the laminated film 120 formed in step S10 of forming the laminated film. The etching-back process may be performed through, for example, a dry etching process or a wet etching process.

Through steps S10 to S30 described above, it is possible to form a polycrystalline silicon film having a desired thickness on the base 110.

The film forming method according to the embodiment is a step performed before step S10 of forming the laminated film, and may include a step of forming a seed layer on the base 110. In the present embodiment, the seed layer is formed using an aminosilane-based gas. Hereinafter, the seed layer formed by using the aminosilane gas is also referred to as an aminosilane seed. Examples of the aminosilane-based gas may include, for example, diisopropylaminosilane (DIPAS), trisdimethylaminosilane (3DMAS), and bis-tertiary butylaminosilane (BTBAS). The seed layer is formed through, for example, a CVD method or an ALD method using the aminosilane-based gas heated to a temperature at which thermal decomposition does not occur. By forming the seed layer on the base 110 as described above, it is possible to reduce roughness of the laminated film 120 formed on the seed layer.

[Operative Effects]

Figure 4A:
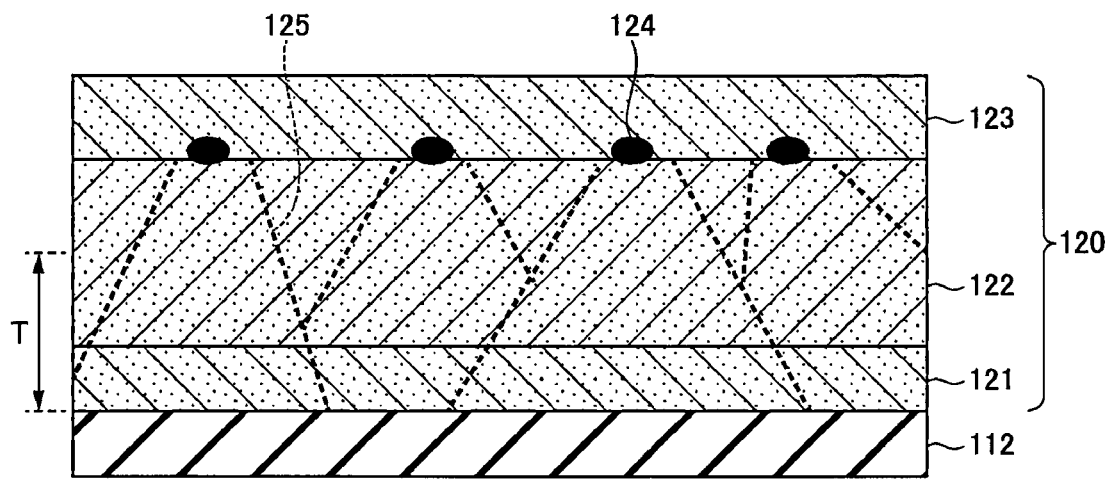
FIGS. 4A and 4B are views for explaining operative effects of the film forming method according to the embodiment.
Figure 4B:
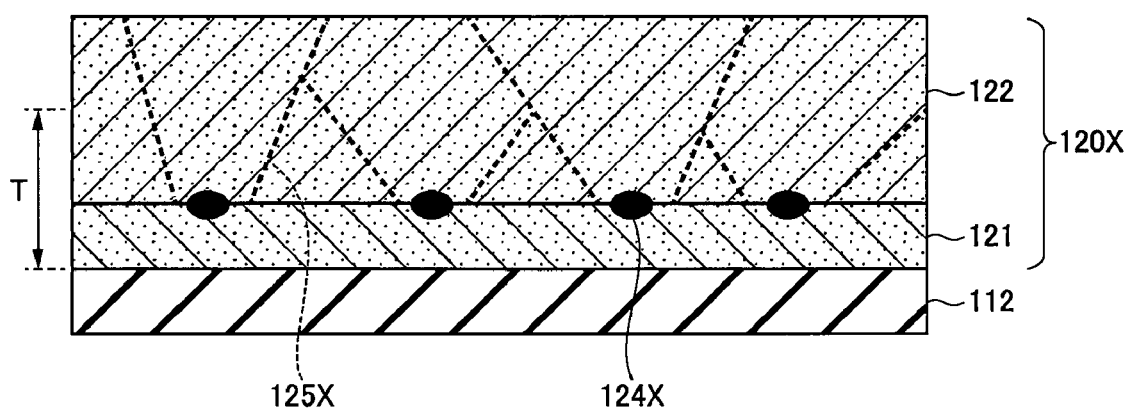

FIGS. 4A and 4B are views for explaining operative effects of the film forming method according to the embodiment. FIG. 4A is a view for explaining a mechanism when the amorphous silicon films forming the laminated film 120, in which the interface layer 121, the bulk layer 122, and the surface layer 123 are laminated in this order, are crystallized. FIG. 4B is a view for explaining a mechanism when amorphous silicon films forming a laminated film 120X, in which the interface layer 121 and the bulk layer 122 are laminated in this order, are crystallized. Both of the laminated film 120 and the laminated film 120X are formed on the insulating film 112.

In the laminated film 120, among the amorphous silicon films of the interface layer 121, the bulk layer 122, and the surface layer 123, the amorphous silicon film of the surface layer 123 is most easily crystallized, and the amorphous silicon film of the interface layer 121 is crystallized the hardest. Therefore, as illustrated in FIG. 4A, crystallization starting from an interface side (a side of the interface layer 121 of the interface layer 121 and the bulk layer 122) is suppressed, whereas crystallization starting from crystal nuclei 124 generated on a surface side (a side of the surface layer 123 of the surface layer 123 and the bulk layer 122) proceeds. As a result, a crystal grain size of the polycrystalline silicon film on the interface side becomes larger than a crystal grain size of the polycrystalline silicon film on the surface side. In other words, the polycrystalline silicon film on the interface side has fewer grain boundaries 125 than the polycrystalline silicon film on the surface side. As a result, when the thickness of the polycrystalline silicon film is reduced to a target film thickness T, it is possible to form a polycrystalline silicon film having a large grain size.

On the other hand, the surface layer 123 is not formed in the laminated film 120X. Therefore, as illustrated in FIG. 4B, crystallization is likely to proceed starting from crystal nuclei 124X generated on an interface side (a side of the interface layer 121 of the interface layer 121 and the bulk layer 122). As a result, a crystal grain size of the polycrystalline silicon film on the interface side becomes smaller than a crystal grain size of the polycrystalline silicon film on the surface side. In other words, the polycrystalline silicon film on the interface side has more grain boundaries 125X than the polycrystalline silicon film on the surface side. As a result, a grain size of the polycrystalline silicon film is reduced when the thickness of the polycrystalline silicon film is reduced to the target film thickness T.

[Film Forming Apparatus]

A film forming apparatus capable of performing the above-described film forming method will be described by taking a batch-type vertical heat treatment apparatus that performs a heat treatment on a large number of substrates at once as an example. However, the film forming apparatus is not limited to the batch-type apparatus, and may be, for example, a single-wafer-type apparatus that processes substrates sheet by sheet.

Figure 5:
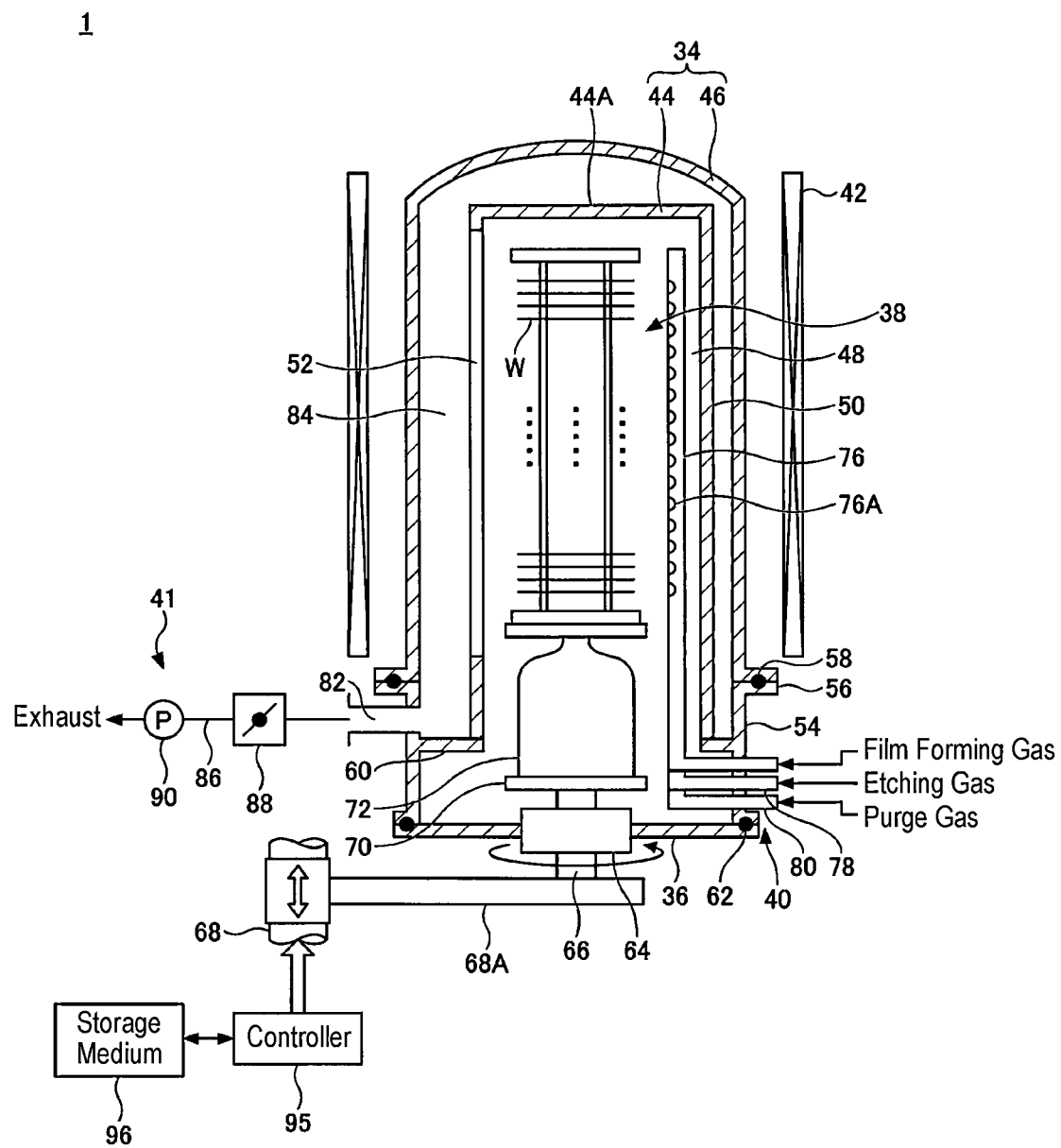
FIG. 5 is a vertical cross-sectional view illustrating an exemplary configuration of a vertical heat treatment apparatus.
Figure 6:
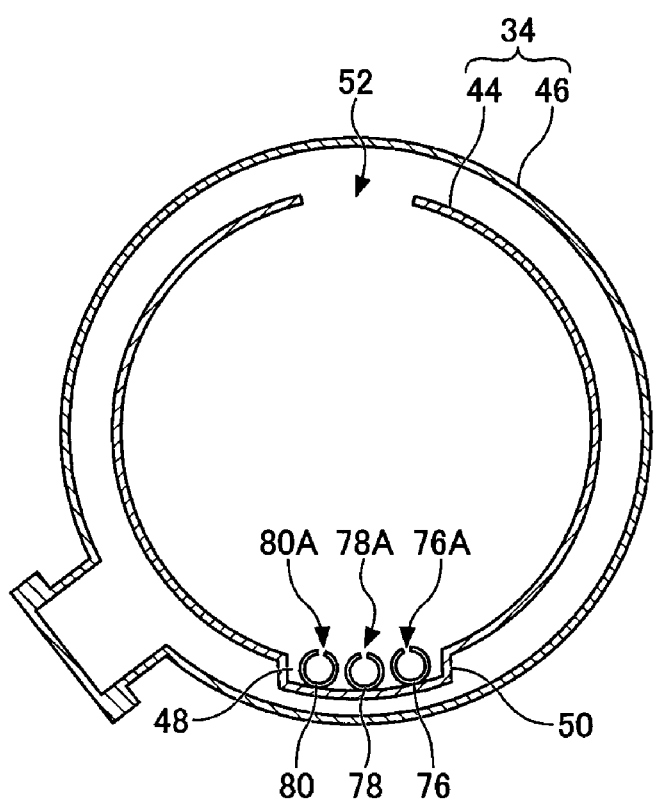
FIG. 6 is a view for explaining a reaction tube of the vertical heat treatment apparatus of FIG. 5.

FIG. 5 is a vertical cross-sectional view illustrating an exemplary configuration of a vertical heat treatment apparatus. FIG. 6 is a view for explaining a reaction tube of the vertical heat treatment apparatus of FIG. 5.

As illustrated in FIG. 5, a vertical heat treatment apparatus 1 includes a reaction tube 34, a lid 36, a wafer boat 38, a gas supplier 40, an exhauster 41, and a heater 42. The reaction tube 34, the lid 36, the wafer boat 38, the gas supplier 40, the exhauster 41, and the heater 42 form a processing part.

The reaction tube 34 is a processing container that accommodates the wafer boat 38. The wafer boat 38 is a substrate holder that holds a number of semiconductor wafers (hereinafter, referred to as "wafers W") at predetermined intervals. The reaction tube 34 includes a cylindrical inner tube 44 having a ceiling and a lower open end, and a cylindrical outer tube 46 having a ceiling and a lower open end to cover the outside of the inner tube 44. The inner tube 44 and the outer tube 46 are formed of a heat-resistant material such as quartz, and are arranged coaxially so as to form a double-tube structure.

A ceiling 44A of the inner tube 44 is, for example, flat. On one side of the inner tube 44, a nozzle accommodator 48 configured to accommodate a gas nozzle along a longitudinal direction thereof (vertical direction) is formed. For example, as illustrated in FIG. 6, a portion of a side wall of the inner tube 44 protrudes outwards so as to form a convex portion 50, and the inside of the convex portion 50 is formed as the nozzle accommodator 48. In the side wall of the inner tube 44 opposite the nozzle accommodator 48, a rectangular opening 52 is formed along a longitudinal direction thereof (vertical direction).

The opening 52 is a gas exhaust port formed to exhaust a gas within the inner tube 44 therefrom. A length of the opening 52 is equal to a length of the wafer boat 38, or extends longer in the vertical direction than the length of the wafer boat 38.

A lower end of the reaction tube 34 is supported by a cylindrical manifold 54 formed of, for example, stainless steel. A flange 56 is formed at an upper end of the manifold 54, and a lower end of the outer tube 46 is installed and supported on the flange 56. A seal 58, such as an O-ring, is interposed between the flange 56 and the lower end of the outer tube 46 so as to hermetically seal the interior of the outer tube 46.

An annular support 60 is provided on an inner wall of an upper portion of the manifold 54, and a lower end of the inner tube 44 is installed and supported on the support 60. The lid 36 is hermetically installed at an opening at a lower end of the manifold 54 via a seal 62, such as an O-ring, so as to hermetically close the opening at the lower end of the reaction tube 34, that is, the opening of the manifold 54. The lid 36 is formed of, for example, stainless steel.

In a central portion of the lid 36, a rotary shaft 66 is provided to penetrate the lid 36 via a magnetic fluid seal 64. A lower portion of the rotary shaft 66 is rotatably supported on an arm 68A of a lifter 68 configured as a boat elevator.

A rotary plate 70 is provided at an upper end of the rotary shaft 66, and the wafer boat 38 that holds the wafers W is placed on the rotary plate 70 via a heat-insulating base 72 formed of quartz. Therefore, by raising and lowering the lifter 68, the lid 36 and the wafer boat 38 move upward and downward as a unit, so that the wafer boat 38 can be inserted into and separated from the reaction tube 34.

The gas supplier 40 is provided in the manifold 54, and introduces gases into the inner tube 44. The gas supplier 40 has a plurality of (e.g., three) gas nozzles 76, 78, and 80 formed of quartz. Each of the gas nozzles 76, 78, and 80 is provided within the inner tube 44 in the longitudinal direction, and has a base end, which is bent in an L shape and penetrates the manifold 54 so as to be supported by the manifold 54.

As illustrated in FIG. 6, the gas nozzles 76, 78, and 80 are installed in the nozzle accommodator 48 of the inner tube 44 and arranged in a row in a circumferential direction. A plurality of gas holes 76A, 78A, and 80A is formed at predetermined intervals in a longitudinal direction of the gas nozzles 76, 78, and 80, respectively, so that a gas can be ejected horizontally from the gas holes 76A, 78A, and 80A. The predetermined interval is set, for example, to be equal to the interval of the wafers W supported by the wafer boat 38. Positions of the gas holes 76A, 78A, and 80A in a height direction are set such that each of the gas holes 76A, 78A, and 80A is located in the middle between vertically adjacent wafers W so as to efficiently supply the gases to a space between the wafers W. As the types of gases, a film forming gas, an etching gas, and a purge gas are used, and the gases are supplied as necessary via the gas nozzles 76, 78, and 80, respectively, while flow rates thereof are controlled.

A gas outlet 82 is formed in an upper side wall of the manifold 54 and above the support 60, so that the gas discharged from the inner tube 44 via the opening 52 is exhausted from the gas outlet 82 via a space 84 between the inner tube 44 and the outer tube 46. The gas outlet 82 is provided with the exhauster 41. The exhauster 41 has an exhaust passage 86 connected to the gas outlet 82. A pressure regulation valve 88 and a vacuum pump 90 are sequentially provided in the exhaust passage 86, so that the interior of the reaction tube 34 can be vacuum-evacuated.

On a side of the outer periphery of the outer tube 46, the cylindrical heater 42 is provided to cover the outer tube 46. The heater 42 heats the wafers W accommodated in the reaction tube 34.

The overall operation of the vertical heat treatment apparatus 1 is controlled by a controller 95. The controller 95 may be, for example, a computer. A computer program that performs the overall operation of the vertical heat treatment apparatus 1 is stored in a storage medium 96. The storage medium 96 may be, for example, a flexible disc, a compact disc, a hard disk, flash memory, a DVD, or the like.

A film forming method according to an embodiment, for example, a method of forming a polycrystalline silicon film on wafers W by using the vertical heat treatment apparatus 1, will be described.

First, the controller 95 controls the lifter 68 to load the wafer boat 38 holding plural sheets of wafers W into the reaction tube 34, and controls the lid 36 to hermetically close and seal the opening at the lower end of the reaction tube 34.

Subsequently, the controller 95 controls the gas supplier 40, the exhauster 41, and the heater 42 to execute step S10 of forming the laminated film, step S20 of crystallizing the laminated film, and step S30 of reducing the thickness of the laminated film in this order. As a result, it is possible to form a polycrystalline silicon film having a large grain size on the wafers W.

In the example described above, the case in which three steps, that is, step S10 of forming the laminated film, step S20 of crystallizing the laminated film, and step S30 of reducing the thickness of the laminated film, are executed in the vertical heat treatment apparatus 1 has been described, but the present disclosure is not limited thereto. For example, when step S30 of reducing the thickness of the laminated film includes an etching-back process using wet etching, step 30 of reducing the thickness of the laminated film may be executed in an apparatus other than the vertical heat treatment apparatus 1.

[Ease of Crystallization]
(Evaluation by Using XRD)

Results obtained by evaluating ease of crystallization of amorphous silicon films by using X-ray diffraction (XRD) will be described.

First, an aminosilane seed and an amorphous silicon film (hereinafter, referred to as "a-Si(SiH$_4$)"), which was formed by using a SiH$_4$ gas, were laminated on a SiO$_2$ film in this order. Subsequently, the laminated film was heat-treated at 550 degrees C., 600 degrees C., and 650 degrees C., and then crystal states were evaluated by using XRD.

In addition, an aminosilane seed and an amorphous silicon film (hereinafter referred to as "a-Si(Cl-dope)"), which was formed by using a mixed gas of a SiH$_4$ gas and a DCS gas and doped with chlorine, were laminated on a SiO$_2$ film in this order. Subsequently, the laminated film was heat-treated at 550 degrees C., 600 degrees C., and 650 degrees C., and then crystal states were evaluated by using XRD.

Figure 7A:
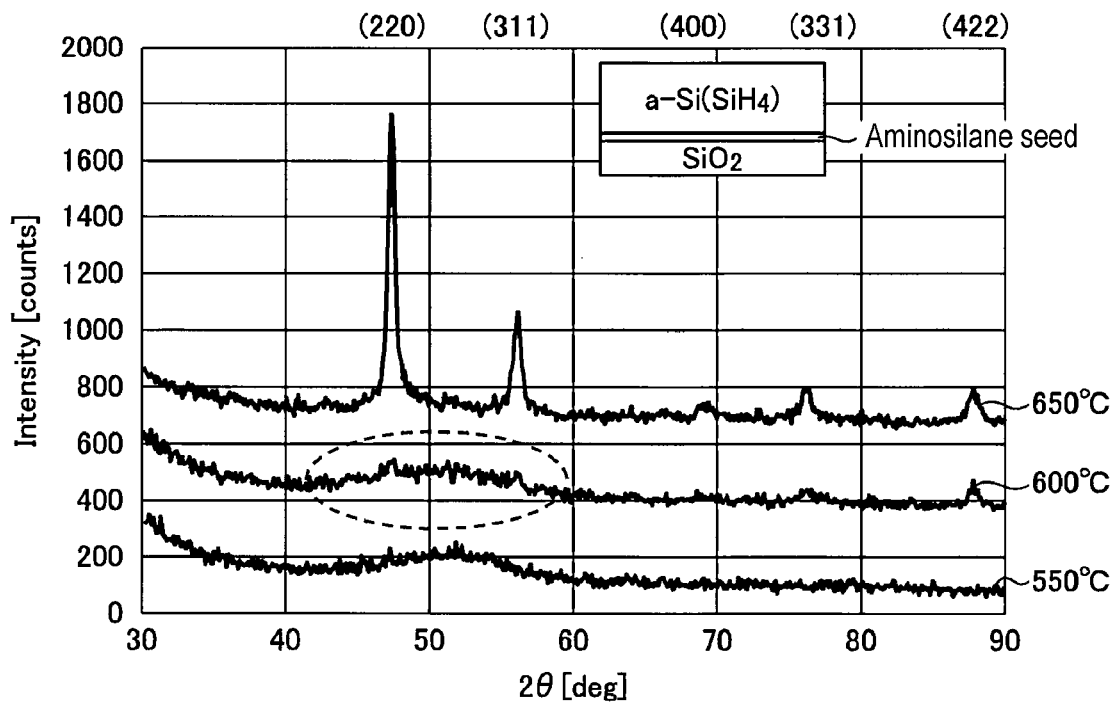
FIGS. 7A and 7B are views showing exemplary evaluation results obtained by using XRD.
Figure 7B:
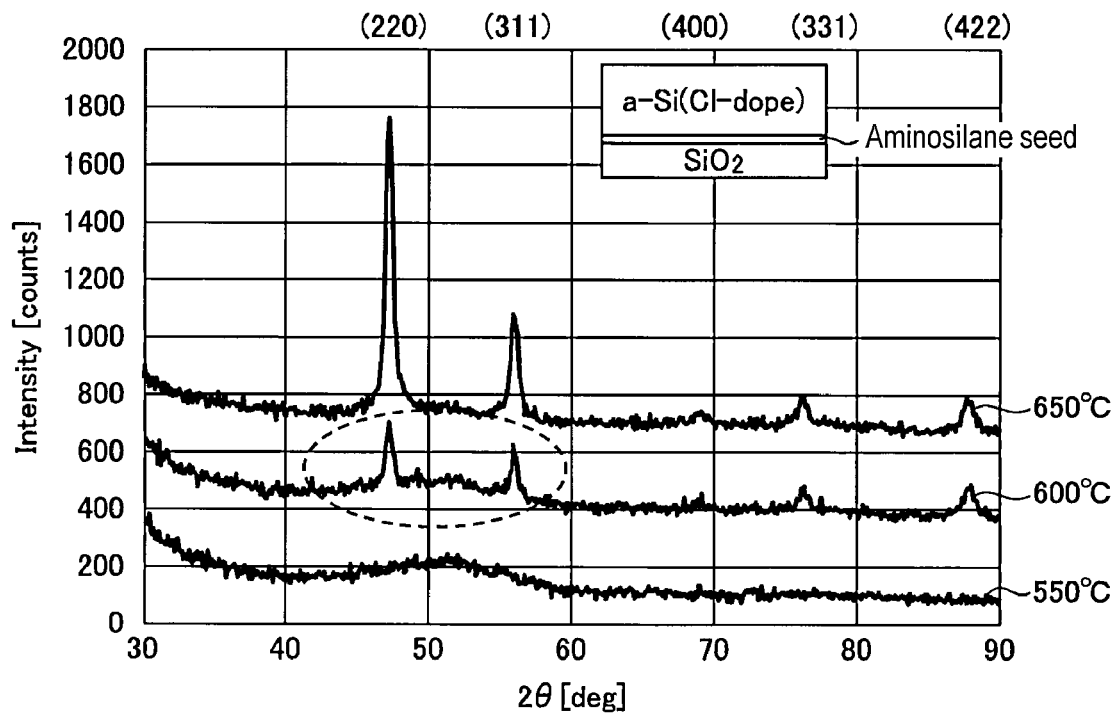

The results obtained by evaluating the crystal states by using XRD are shown in FIGS. 7A and 7B. FIGS. 7A and 7B are views showing exemplary evaluation results obtained by using XRD. FIG. 7A shows a result obtained in the laminated film in which an aminosilane seed and a-Si(SiH$_4$) were laminated in this order on a SiO$_2$ film. FIG. 7B shows a result obtained in the laminated film in which an aminosilane seed and a-Si(Cl-dope) were laminated in this order on a SiO$_2$ film. In FIGS. 7A and 7B, a diffraction angle 2θ [deg] is represented on the horizontal axes, and a diffraction X-ray intensity [counts] is represented on the vertical axes.

In a-Si(SiH$_4$), a peak of the Si (220) plane did not appear when the heat treatment was performed at 600 degrees C., as shown in FIG. 7A. On the other hand, in a-Si(Cl-dope), a peak of the Si (220) plane appeared when the heat treatment was performed at 600 degrees C., as shown in FIG. 7B.

In addition, in a-Si(SiH$_4$), a peak of the Si (311) plane did not appear when the heat treatment was performed at 600 degrees C., as shown in FIG. 7A. On the other hand, in a-Si(Cl-dope), a peak of the Si (311) plane appeared when the heat treatment was performed at 600 degrees C., as shown in FIG. 7B.

From the above results, it can be said that a-Si(Cl-dope) is easier to crystallize than a-Si(SiH$_4$).

(Evaluation by Using SIMS)

Results obtained by analyzing factors, which affect the ease of crystallization of amorphous silicon films, by using secondary ion mass spectrometry (SIMS) will be described.

First, a concentration of hydrogen (H) contained in each of films (hereinafter referred to as an "in-film hydrogen concentration") of a-Si(SiH$_4$) and a-Si(Cl-dope) before heat treatment and a concentration of chlorine (Cl) contained in each of films (hereinafter referred to as an "in-film chlorine concentration") of a-Si(SiH$_4$) and a-Si(Cl-dope) before heat treatment were measured by using SIMS. In addition, the in-film hydrogen concentrations and the in-film chlorine concentrations of a-Si(SiH$_4$) and a-Si(Cl-dope) after the heat treatment were measured by using SIMS. The measurement results are shown in FIG. 8.

FIG. 8 is a view showing exemplary evaluation results obtained by using SIMS. FIG. 8 shows average values of the in-film hydrogen concentrations and average values of the in-film chlorine concentrations at a depth of 15 nm to 20 nm from the surfaces of the films.

As shown in FIG. 8, in both cases of before heat treatment and after heat treatment, there was almost no difference between the in-film hydrogen concentration of a-Si(SiH$_4$) and the in-film hydrogen concentration of a-Si(Cl-dope). On the other hand, in both cases of before heat treatment and after heat treatment, the in-film chlorine concentration of a-Si(Cl-dope) was higher than the in-film chlorine concentration of a-Si(SiH$_4$) by one or two digits.

From the above results, it is considered that chlorine contained in the amorphous silicon films promotes crystallization.

(Evaluation by Using Spectroscopic Ellipsometry)

Results obtained by evaluating the ease of crystallization of amorphous silicon films by using extinction coefficients (k values) in spectroscopic ellipsometry will be described.

First, an aminosilane seed and a-Si(SiH$_4$) were laminated on a SiO$_2$ film in this order. A thickness of the aminosilane seed/a-Si(SiH$_4$) laminated film was set to 30 nm. Subsequently, the laminated film was heat-treated at 550 degrees C., 575 degrees C., 600 degrees C., 625 degrees C., and 650 degrees C. for twelve hours, and then k values were calculated by measuring the heat-treated laminated film by using spectroscopic ellipsometry.

In addition, an aminosilane seed and a-Si(Si$_2$H$_6$) were laminated on a SiO$_2$ film in this order. A thickness of the aminosilane seed/a-Si(Si$_2$H$_6$) laminated film was set to 30 nm. Subsequently, the laminated film was heat-treated at 550 degrees C., 575 degrees C., 600 degrees C., 625 degrees C., and 650 degrees C. for twelve hours, and then k values were calculated by measuring the heat-treated laminated film by using spectroscopic ellipsometry.

Figure 9:
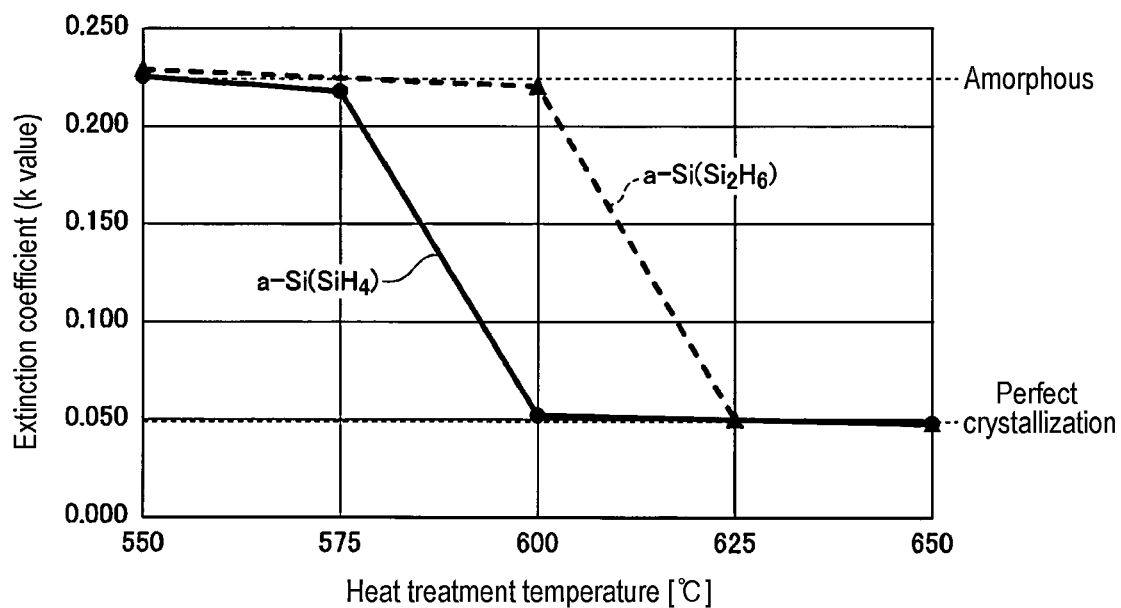
FIG. 9 is a view showing exemplary evaluation results obtained by using spectroscopic ellipsometry.

FIG. 9 shows the results of calculation of k values by using spectroscopic ellipsometry. FIG. 9 is a view showing exemplary evaluation results obtained by using spectroscopic ellipsometry. In FIG. 9, the heat treatment temperature [degrees C.] is represented on the horizontal axis, and the extinction coefficient (k value) is represented on the vertical axis. In FIG. 9, the solid line shows k values in the aminosilane seed/a-Si(SiH$_4$) laminated film, and the broken line shows k values in the aminosilane seed/a-Si(Si$_2$H$_6$) laminated film.

As shown in FIG. 9, when the heat treatment temperature was 600 degrees C., the k value of the aminosilane seed/a-Si(SiH$_4$) laminated film was smaller than the k value of the aminosilane seed/a-Si(Si$_2$H$_6$) laminated film. From this result, the aminosilane seed/a-Si(SiH$_4$) laminated film is more likely to crystallize than the aminosilane seed/a-Si (Si$_2$H$_6$) laminated film. The amorphous silicon film formed by using a Si$_2$H$_6$ gas contains more H (hydrogen) in the film than the amorphous silicon film formed by using a SiH$_4$ gas. It is considered that the difference in in-film hydrogen concentration affects the ease of crystallization.

[Starting Point of Crystallization]
(Evaluation by Using Spectroscopic Ellipsometry)

Results obtained by evaluating starting points of crystallization of amorphous silicon laminated films by using extinction coefficients (k values) in spectroscopic ellipsometry will be described.

First, an aminosilane seed, an amorphous silicon film formed by using a Si$_2$H$_6$ gas (hereinafter, referred to as "a-Si(Si$_2$H$_6$)"), and a-Si(SiH$_4$) were laminated on a SiO$_2$ film in this order. A thickness of the aminosilane seed/a-Si (Si$_2$H$_6$)/a-Si(SiH$_4$) laminated film was set to 40 nm. Subsequently, the laminated film was heat-treated at 550 degrees C., 575 degrees C., 600 degrees C., 625 degrees C., and 650 degrees C. for twelve hours, and then k values were calculated by measuring the heat-treated laminated film by using spectroscopic ellipsometry.

In addition, an aminosilane seed, a-Si(Si$_2$H$_6$), a-Si(SiH$_4$), and a-Si(Cl-dope) were laminated on a SiO$_2$ film in this order. A thickness of the aminosilane seed/a-Si(Si$_2$H$_6$)/a-Si (SiH$_4$)/a-Si(Cl-dope) laminated film was set to 40 nm. Subsequently, the laminated film was heat-treated at 550 degrees C., 575 degrees C., 600 degrees C., 625 degrees C., and 650 degrees C. for twelve hours, and then k values were calculated by measuring the heat-treated laminated film by using spectroscopic ellipsometry.

Figure 10:
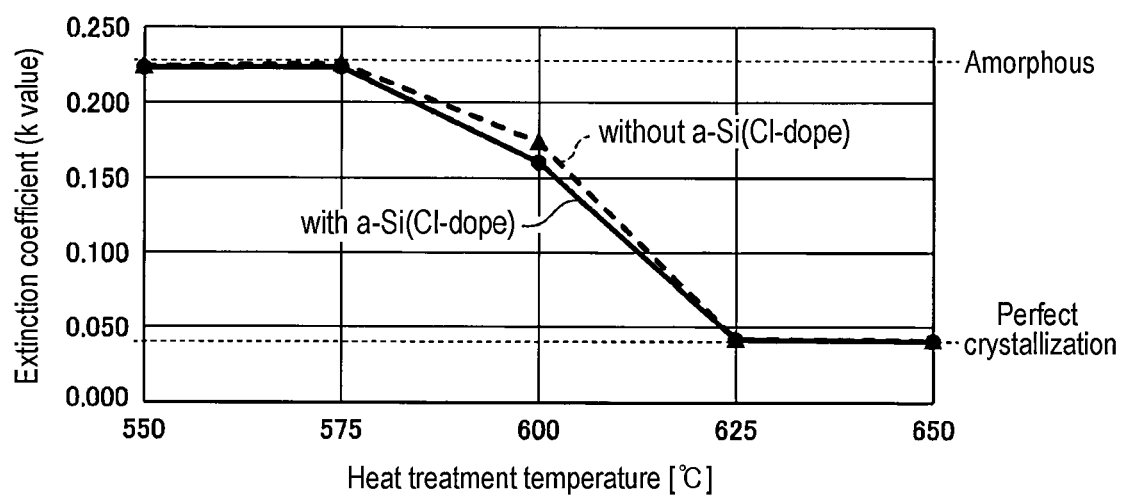
FIG. 10 is a view showing another example of evaluation results obtained by using spectroscopic ellipsometry.

FIG. 10 shows the results of calculation of k values by using spectroscopic ellipsometry. FIG. 10 is a view showing other exemplary evaluation results obtained by using spectroscopic ellipsometry. In FIG. 10, the heat treatment temperature [degrees C.] is represented on the horizontal axis, and the extinction coefficient (k value) is represented on the vertical axis. In FIG. 10, the solid line shows k values in the aminosilane seed/a-Si(Si$_2$H$_6$)/a-Si(SiH$_4$)/a-Si(Cl-dope) laminated film, and the broken line shows k values in the aminosilane seed/a-Si(Si$_2$H$_6$)/a-Si(SiH$_4$) laminated film.

As shown in FIG. 10, when the heat treatment temperature was 600 degrees C., the k value of the amorphous silicon laminated film in which a-Si(Cl-dope) was formed on the outermost surface thereof was smaller than the k value of the amorphous silicon laminated film in which no a-Si (Cl-dope) is formed on the outermost surface thereof. From this result, it can be seen that the amorphous silicon laminated film is easily crystallized when a-Si(Cl-dope) is formed on the outermost surface thereof. It is considered that this is because, by forming a-Si(Cl-dope) on the outermost surface, crystallization proceeds from a-Si(Cl-dope) as a starting point.

(Evaluation by Using TEM)

Results obtained by observing a cross section of an amorphous silicon film in a process of crystallization by using a transmission electron microscope (TEM) will be described.

First, an aminosilane seed, a-Si(Si$_2$H$_6$), a-Si(SiH$_4$), and a-Si(Cl-dope) were laminated on a SiO$_2$ film in this order. Subsequently, the laminated film was heat-treated at 600 degrees C. for twelve hours, and then the cross section of the laminated film was observed by using the TEM. The result obtained by observing the cross section of the laminated film by using the TEM is shown in FIG. 11.

Figure 11:
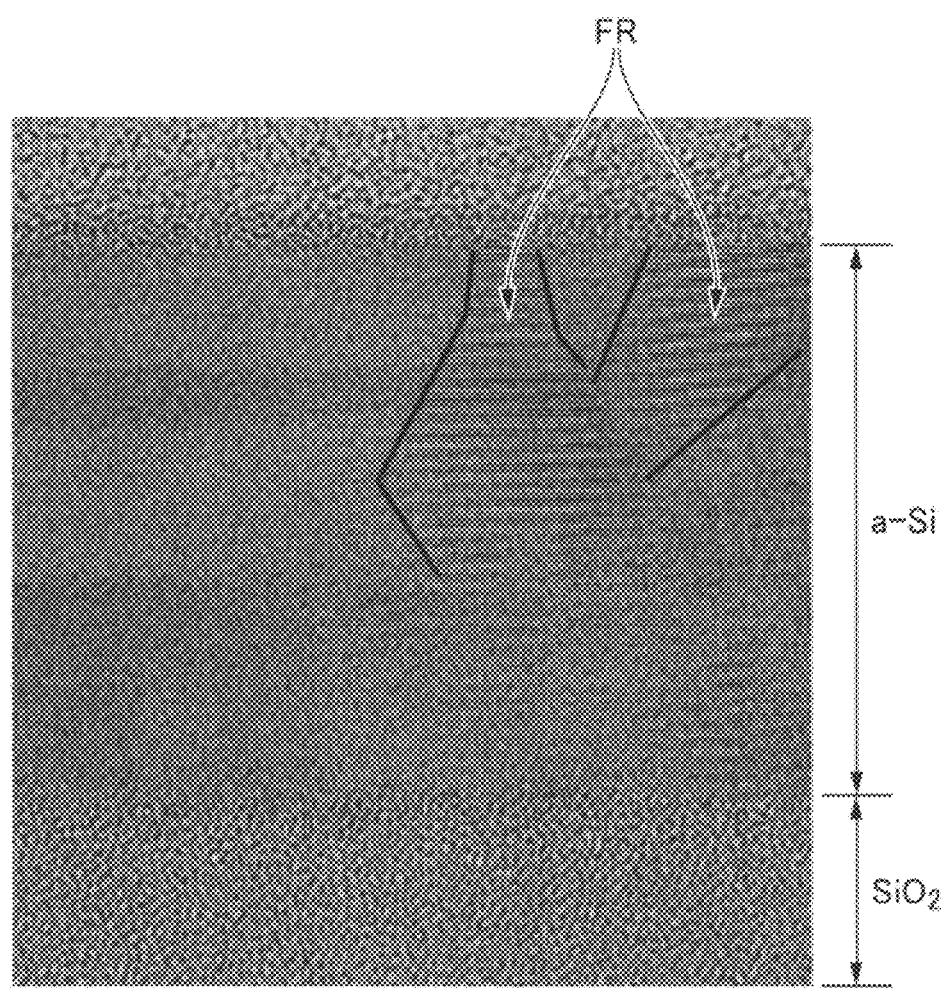
FIG. 11 is a view showing an exemplary evaluation result obtained by using a TEM.

FIG. 11 is a view showing an exemplary evaluation result obtained by using the TEM. As shown in FIG. 11, it can be seen that interference fringes FR indicating crystallization were generated on the surface side of the amorphous silicon (a-Si) film. From this result, it can be seen that in the aminosilane seed/a-Si(Si$_2$H$_6$)/a-Si(SiH$_4$)/a-Si(Cl-dope) laminated film, crystal growth on the surface side of the laminated film is likely to proceed. That is, it is considered that crystal growth proceeds from the surface side of the laminated film.

In the embodiments described above, the case where the film formed by the film forming method is a polycrystalline silicon film has been described, but the present disclosure is not limited thereto. For example, the film formed by the film forming method may be a polycrystalline silicon germanium film or a polycrystalline germanium film.

According to the present disclosure, it is possible to form a polycrystalline silicon film having a large particle size.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
   forming a laminated film, in which an interface layer, a bulk layer, and a surface layer are laminated in this order, on a base; and
   crystallizing the laminated film,
   wherein the bulk layer is formed of a film that is easier to crystallize than the interface layer in crystallizing the laminated film, and
   wherein the surface layer is formed of a film that is easier to crystallize than the bulk layer in crystallizing the laminated film.

2. The film forming method of claim 1, further comprising:
   reducing a thickness of the laminated film after crystallizing the laminated film.

3. The film forming method of claim 2, wherein the thickness of the laminated film formed in forming the laminated film is greater than a target film thickness, and
   wherein reducing the thickness of the laminated film includes reducing the thickness of the laminated film to the target film thickness.

4. The film forming method of claim 1, wherein the bulk layer has a multi-layer structure, and wherein each layer of the multi-layer structure is formed of a film that is easier to crystallize than the interface layer in crystallizing the laminated film.

5. The film forming method of claim 1, wherein each of the interface layer and the bulk layer is formed of a film containing silicon and hydrogen, and
wherein in-film concentrations of hydrogen are lower in an order of the interface layer and the bulk layer.

6. The film forming method of claim 5, wherein the surface layer is formed of a film containing silicon and impurities that promote crystallization.

7. The film forming method of claim 5, wherein the surface layer is formed of a film containing silicon and hydrogen, and
wherein the in-film concentrations of hydrogen are lower in an order of the interface layer, the bulk layer, and the surface layer.

8. The film forming method of claim 1, wherein the interface layer is formed of a film containing silicon and impurities that inhibit crystallization,
wherein the bulk layer is formed of a film containing silicon, and
wherein the surface layer is formed of a film containing silicon and impurities that promote crystallization.

9. The film forming method of claim 8, wherein the impurities that inhibit crystallization are oxygen, carbon, or nitrogen.

10. The film forming method of claim 6, wherein the impurities that promote crystallization is chlorine, phosphorus, boron, germanium, aluminum, nickel, or fluorine.

11. The film forming method of claim 6, wherein the surface layer is formed by doping a surface of the bulk layer with the impurities that promote crystallization.

12. The film forming method of claim 1, wherein the surface layer is formed of silicon-free impurities that promote crystallization.

* * * * *